United States Patent [19]

Farag et al.

[11] Patent Number: 5,629,870
[45] Date of Patent: May 13, 1997

[54] METHOD AND APPARATUS FOR PREDICTING ELECTRIC INDUCTION MACHINE FAILURE DURING OPERATION

[75] Inventors: Samir F. Farag, Roswell; Thomas G. Habetler, Snellville; Jay H. Schlag, Marietta, all of Ga.

[73] Assignee: Siemens Energy & Automation, Inc., Alpharetta, Ga.

[21] Appl. No.: 251,814

[22] Filed: May 31, 1994

[51] Int. Cl.$^6$ ................................................ G01R 23/00
[52] U.S. Cl. .................. 364/551.01; 364/494; 364/485; 395/912; 395/22; 324/558; 324/76.21; 340/679
[58] Field of Search ............................ 324/76.19, 76.22, 324/76.21, 772, 557–559, 520; 364/485–488, 492–494, 551.01; 395/21, 20, 50, 908, 907, 915, 912; 361/31; 340/635, 679

[56] References Cited

U.S. PATENT DOCUMENTS

| | | | |
|---|---|---|---|
| 4,377,784 | 3/1983 | Saito et al. | 324/158 |
| 4,639,996 | 2/1987 | Fullmer | 29/407 |
| 4,888,541 | 12/1989 | Russell | 318/696 |
| 4,914,386 | 4/1990 | Zocholl | 324/158 |
| 4,965,513 | 10/1990 | Haynes et al. | 324/158 MG |
| 4,978,909 | 12/1990 | Hendrix et al. | 324/77 |
| 5,247,448 | 9/1993 | Liu | 364/576 |
| 5,251,151 | 10/1993 | Demjanenko et al. | 364/551.02 |
| 5,253,184 | 10/1993 | Kleinschnitz | 364/550 |
| 5,270,640 | 12/1993 | Kohler et al. | 324/158 |
| 5,305,235 | 4/1994 | Izui et al. | 364/551.01 |

OTHER PUBLICATIONS

Habetler et al., "Effects of time–varying loads on rotor fault detection in induction machine"; Proceedings of IEEE Industry Application Society Annual Meeting, Abstract. Feb. 10, 1993.

Filippetti et al., "Development of expert system knowledge base to on-line diagnosis of rotor electrical faults of induction motors", IEEE Industry applications society annaul meeting, vol. 1, pp. 92–99 1992.

"Archiv fur Elektrotechnik, Der Stabbruch im Käfigläufer eines Asynchronmotors" (9 pages) © 1984 Springer–Verlag, English Translation of German document (28 pages) attached.

Alternatives For Assessing The Electrical Integrity Of Induction Motors, 89 CH 2792 © 1989 IEEE (10 pages).

An On–Line Method To Detect Incipient Failure Of Turn Insulation In Random–Wound Motors; Document No. 93 WM 021–6 EC; © 1993 IEEE, (7 pages).

Induction Motor Fault Diagnosis; 118.QP.10M (9 pages) © 1988 Entek Scientific Corporation, 4480 Lake Forest Drive, Suite 316, Cincinnati, OH 45242.

(List continued on next page.)

Primary Examiner—Emanuel T. Voeltz
Assistant Examiner—Kamini S. Shah
Attorney, Agent, or Firm—Peter A. Luccarelli, Jr.

[57] ABSTRACT

Methods and apparatus for identifying in real time an operating condition of an in-service electrical device which draws a power load by monitoring spectral content of the power signature and associating spectral components with device operating conditions. In the preferred embodiment, motor (12) power line current signature is sampled by data conditioning sampler (18). Preprocessor (30) spectrally separates the current signature into plural frequency domain components having respective frequency and magnitude values. Spectral characteristic component selector filter (40) selects for analysis at least one specific spectral component by referencing a base of stored knowledge of operational characteristics of the motor. A neural network (50) associates without supervision the selected detected spectral component with an operating condition of the motor (12). The base of stored knowledge is updated with new operating condition associations which have been made during real-time monitoring. A post processor (60) may enunciate the association to a user via an output device and it may generate a control signal to operate electrical distribution system protection or control apparatus.

29 Claims, 5 Drawing Sheets

Microfiche Appendix Included
(3 Microfiche, 263 Pages)

OTHER PUBLICATIONS

MachineView System Description (8 pages) CSI–Computational Systems Incorporated, 835 Innovation Drive, Knoxville, TN 37932. No Date.

Motor Check Induction Motor Current Analysis Program Brochure (4 pages) CSI–Computational systems Incorporated, 835 Innovation Drive, Knoxville, TN 37932. No Date.

Motor Check "What are your motors trying to tell you?" One-page advertisement. No Date.

Pinpoint Induction Motor Faults By Analyzing Load Current, pp. 87–88; Power Magazine, Oct. 1987, written by John Reason.

Noninvasive Detection of Broken Rotor Bars in Operating Induction Motors, Document No. 88 WM 012–8, (7 pages); © 1988 IEEE, written by G.B. Kilman, et al.

Induction Motor Fault Detection Via Passive Current Monitoring, pp. 12–17, written by G.B. Kilman, et al. No Date.

METHOD AND APPARATUS FOR PREDICTING ELECTRIC INDUCTION MACHINE FAILURE DURING OPERATION

MICROFICHE APPENDIX

The computer program listings referred to herein as being part of Appendix E are included in 3 microfiche, having a total of 263 frames.

BACKGROUND OF THE INVENTION

The present invention is directed to methods and apparatus which monitor power line waveform that is affected by an electrical device, such as for example an induction machine, during actual in-service operation of the machine in its working environment. Based upon analysis of the line waveform signature, the present invention predicts potential machine failure caused by defects in machine mechanical components, such as broken rotor bars and defective rolling element bearings which support the machine shaft.

Electric induction motors are a workhorse of any industrial or commercial facility. They are used for many applications ranging from driving compressors and pumps, to blowers and machine tools. It is not uncommon to have thousands of such motors in one industrial facility.

Although motors are simple and reliable machines, their annual failure rate is conservatively estimated at 5% per annum. In some industries, such as pulp and paper processing, this failure rate can be as high as 12% annually. According to market research of the present owner of this application, 3.4 million so-called National Electrical Manufacturers Association (NEMA)-rated motors, which are defined as three phase, 600 Volt AC or less, and 400 HP or less, are sold annually in the United States of America. Over 80% of these motors are 20 HP or less. The installed base in the United States alone is assumed to be approximately 50 million motors.

Down time in a factory can be extremely expensive, and in many cases far exceeds the replacement and installation cost of the motor itself. According the Electric Power Research Institute (EPRI) and the Institute of Electrical and Electronic Engineers (IEEE), the majority of motor failures, 51% to 64%, are the result of, or result in mechanical failures, and 35% to 37% are due to thermal failures of the motor insulation.

The vast majority electric induction motors now installed in the United States of America and the other developed industrial nations are protected by thermal overload relays, based on 40-year-old technology. These relays attempt to emulate the thermal behavior of the motor; however, they fall far short because their time constant utilized for heat transfer modelling is far less than the true thermal time constant of the motor, resulting in inadequate thermal protection. A new generation of microprocessor-based relays which provide far better modeling of the motor thermal behavior have been introduced recently; however, their installed base is very small, less than 1%. Neither the thermal nor the microprocessor-based motor protection relays provide protection against motor mechanical component failures. This explains the relatively high percentage of motor failures.

Many failures in electric machines are the result of, or result in abnormally high vibrations in the machine itself. Undesirable vibrations can be caused by mechanical problems in the machine, such as worn or defective bearings, eccentricities in the rotor or stator, or any number of other structural deteriorations. In addition, machines which are subject to high vibrations from any source are prone to failure, especially due to shorted stator windings and insulation breakdown.

There has been a long-felt need in the motor industry to identify undesirable motor mechanical vibrations and to attempt to correlate identified vibrations with specific operational fault conditions which cause the specific vibration. In the past, many industrial plants would rely on skilled mechanics and technicians who would examine each running motor individually by hand. The mechanic would rely on his or her skilled tactile, auditory and visual senses, along with general intuitive experience, to correlate operational sounds and vibration with specific problems. For example, a faulty rolling element bearing race would have a different vibrational amplitude or frequency than a rotor bar developing a mechanical fault. Such direct hand sensing of potential faults by a skilled mechanic is dependent upon such factors as the mechanic's skill level, the frequency of inspections, the difficulty of carrying out inspections of many motors in hazardous or hard-to-reach environments, all combined with a healthy dose of luck that the mechanic inspects sufficiently before failure in order to correct the problem before it causes factory downtime. A modern industrial plant cannot afford to rely on such widely disseparate factors, hence in the past, many mechanized techniques have been tried to predict motor failure.

One long-known, but difficult and expensive solution has been to adopt aggressive preventive maintenance schedules, with the hope that components on average are replaced before they are likely to fail. Using industrial engineering statistical models of mean time between failure, parts such as bearings are routinely replaced well before statistical predicted failure. Unfortunately, statistics do not predict the failure of a specific individual component. A specific bearing rated for replacement every 5,000 running hours may in fact fail within a few hundred hours.

Another known failure prediction technique has been to measure actual mechanical vibration with vibration sensors mounted on the machine. The spectral component content (i.e., the magnitude and frequency of vibration) of the vibration excitation signal can then be used to determine if a problem exists in the machine, or if one of the above-mentioned failure modes is likely. Then, the underlying task is to determine how the vibrations in electric machines relate to physical defects in the machine and, more fundamentally, what types of vibrations (i.e., vibration component frequencies and magnitudes) indicate possible machine failures. Such systems have their own problems. For one, addition of a vibration sensor and related electronics adds expensive components to the system. These sensing components are relatively too delicate for industrial environments and are prone to failure. When the vibration sensing systems are operated continuously in a relatively high vibration noise environment of a factory, they can trigger false failure readings. Isolation of line and load noise by diagnostic bench testing motors in a repair shop is not a viable option in most industrial environments, because of difficulties in motor removal and reinstallation. The factory cannot be shut down frequently to remove and replace motors for diagnostic testing, except perhaps during defined plant down time, such as on holidays.

Many problems in electric machines, including all of those which cause undesirable vibrations, result in unwanted harmonic electric currents in the machine. These are due to nonuniformaties in the air gap flux, or oscillations (vibrations) in the mechanical load torque on the machine.

In either case, the defective machine is no longer modeled by a constant parameter circuit in steady-state operation. As a result, harmonic currents exist in the stator. The harmonic content of the stator current can then be used to determine not only undesirable vibrations in the machine, but also electrical problems, such as damaged or broken rotor bars and end rings, and damaged stator windings. Unfortunately, as with mechanical vibration noise, industrial environments are also rich in electrical distribution system harmonic noise. Thus, known electrical current signature analyzers cannot associate power waveform characteristics with motor operating characteristics; they have been of the nature of bench analyzers rather than in-service, active diagnostic tools which are continuously observing operational motors on the factory floor.

Examining more closely the known electric induction machine direct mechanical vibration measurement and current harmonic analysis testing systems, each has strengths and weaknesses. Direct vibration measurement has the obvious advantage of measuring the harmful vibrations directly through the use of one or more piezoelectric vibration sensors. In addition, signal processing hardware is reduced since the signature to be analyzed need not be extracted from a much higher magnitude carrier signal, as in the case with current harmonic analysis. The disadvantage of the direct measurement is the fact that the machine must be outfitted with the sensor, and the sensor with its wiring is prone to failure. The current harmonic analysis has the advantage of not requiring any sensors in addition to those which already exist in currently available motor controllers. However, current harmonic analysis is computationally difficult since the harmonics in question are many times smaller in magnitude than the excitation frequency (i.e., 50 or 60 Hertz electric utility power). In addition, an understanding must be gained of the relationship between the current harmonics and machine vibrations and resultant motor electrical performance deterioration.

Commercial products are available which detect induction machine incipient fault by current signature harmonic analysis. Generally, the products include a personal computer which performs motor current signature analysis and displays the results of this analysis. The products are basically spectrum analyzers which indicate possible machine problems associated with each distinct harmonic identified in the current spectrum. All of these products are intended to be used as maintenance tools and are not specifically intended for continuous on-line use. This is essentially due to the fact that a trained user must interpret the information provided by the spectral analysis and associate the information with a machine operating condition. Present harmonic analysis systems are also relatively expensive.

Technical literature on induction machine fault detection using current spectral analysis deals with the subject of detecting faults in the rotor of the machine. The problem of broken rotor bars, most common in large machines, has been studied.

Previously known induction machine current signature harmonic analysis systems have the following disadvantages:

1. Known systems require a human expert to interpret the motor signature and associate the motor signature with a motor operating condition, in order to determine if the motor is "good" or "bad".

2. Known systems are relatively expensive, and therefore are limited for use with large, expensive motors. Typical cost for these systems is between U.S. $20,000 and $50,000.

3. Known systems are designed specifically to detect broken rotor bars, a common failure mode in very large motors but infrequent in small motors.

4. Known systems require detailed structural knowledge of the motor design, such as the number of stator slots, rotor bars and quantity of rolling elements in shaft bearing.

5. Known systems are intended for use as a maintenance tool to perform bench tests on individual motors that are not driving loads.

There has been a long-felt need in the motor industry for methods and apparatus for predicting electric induction machine failures in an "on-line", "in-service" fashion, without additional sensors; that is, while the machine is in use, so that the user/operator can be notified when a machine failure is imminent without removing the machine from service. The needed methods and apparatus must also take into account the fact that the specific physical characteristics of the machine are not known. Since it is desired that failures be predicted in any arbitrary machine connected to the present invention apparatus, the prediction scheme must work without the knowledge of the machine design parameters. The on-line failure prediction scheme can then be incorporated into a microcomputer-based motor controller, which gives the user a significantly higher degree of motor protection than is currently available.

SUMMARY OF THE INVENTION

It is an object of the present invention to create a failure prediction system which solves one or more of the previously identified disadvantages of known failure prediction techniques; specifically:

1. The present invention associates in an unsupervised manner spectral components of the electrical device power waveform with operating conditions of the device.

2. The present invention is intended to be constructed at a cost comparable with the cost of a low horsepower induction motor, i.e. approximately several hundred U.S. dollars.

3. The present invention is intended to predict many types of mechanical faults, in addition to broken rotor bars. Examples include bearing failure, rotating mass imbalance, and loose fasteners which induce vibrations.

4. The present invention does not require detailed motor structural design knowledge, e.g., number of stator slots, rotor bars, etc.

5. The present invention is intended to be utilized in the electrical device actual operating environment, so that it may continuously monitor the device in an on-line fashion.

It is an object of the present invention to create a method and apparatus for predicting imminent failures for an electrical device, such as a motor, working with an arbitrary driven load in an electrical distribution system, while the motor is operational and running on-line.

It is also an object of the present invention to create a method and apparatus for predicting mechanical failures for an electrical device, such as a motor, which does not rely on electromechanical sensing devices, such as vibration sensors, for failure prediction information.

The objects of the present invention are realized by the method and apparatus of the present invention. One aspect of the present invention features a method for identifying an operating condition of an electrical device which draws a power load on a power line of an electrical distribution system including: monitoring in real time a power line waveform having a signature influenced by varying driven loads associated with at least one electrical device; spectrally separating at least a representative portion of the power line waveform into plural frequency domain components; selecting for analysis at least one specific component of the plurality of components based on at least one of frequency and magnitude values of the component by referencing a base of stored knowledge of representative operational characteristics of the electrical device; and associating in real time the selected component with an operating condition of the electrical device by referencing the base of stored knowledge.

Another aspect of the present invention features a method for identifying an operating condition of an electric induction motor which draws a power load on a power line of an electrical distribution system including: powering a motor with a power line of an electrical distribution system; monitoring in real time power line current signature which is influenced by operating conditions of the motor; selecting and analyzing automatically at least one of specific spectral components of the power line current by referencing a base of stored knowledge of representative operational characteristics of the motor; associating automatically the selected component with an operating condition of the motor by referencing the base of stored knowledge; identifying a previously unknown motor operating condition and updating the base of stored knowledge with at least one of at least a portion of new selected components and new motor operating condition associations.

Another feature of the present invention is directed to an apparatus for identifying an operating condition of an electrical device which operates as one of a power source and load on a power line of an electrical distribution system including: a data conditioning sampler for monitoring in real a time power line waveform having a signature influenced by varying loads associated with at least one electrical device; a preprocessor, coupled to the data conditioning sampler, for spectrally separating the power line waveform into plural frequency domain components; a spectral characteristic component selector filter, coupled to the preprocessor for selecting for analysis at least one specific component of the plurality of components by referencing a base of stored knowledge of representative operational characteristics of the electrical device; and an association device, coupled to the component selector filter, for associating in real time without supervision the selected component with an operating condition of the electrical device by referencing the base of stored knowledge.

The present invention also features an apparatus for identifying an operating condition of an electric induction motor which draws a power load from a power line of an electrical distribution system including: an induction motor powered by a power line of an electrical distribution system, the power line carrying a waveform having a signature influenced by the motor operating conditions; a data conditioning sampler, coupled to the power line, for monitoring in real time power line waveform; a spectral characteristic component selector filter, coupled to the data conditioning sampler, for selecting for analysis at least one specific spectral component of the power line waveform by referencing a base of stored knowledge of representative operational characteristics of the motor; an association device, coupled to the component selector filter, for associating automatically without supervision the selected component with an operating condition of the motor by referencing the base of stored knowledge; an enunciation device, coupled to the association device, for identifying a previously unknown motor operating condition; and an updating device, coupled to the base of stored knowledge and at least one of the component selector filter and the association device, for updating the base of stored knowledge with at least one of a portion of new selected components and new motor operating condition associations.

DESCRIPTION OF THE PREFERRED EMBODIMENTS

System Overview

Figure 1:
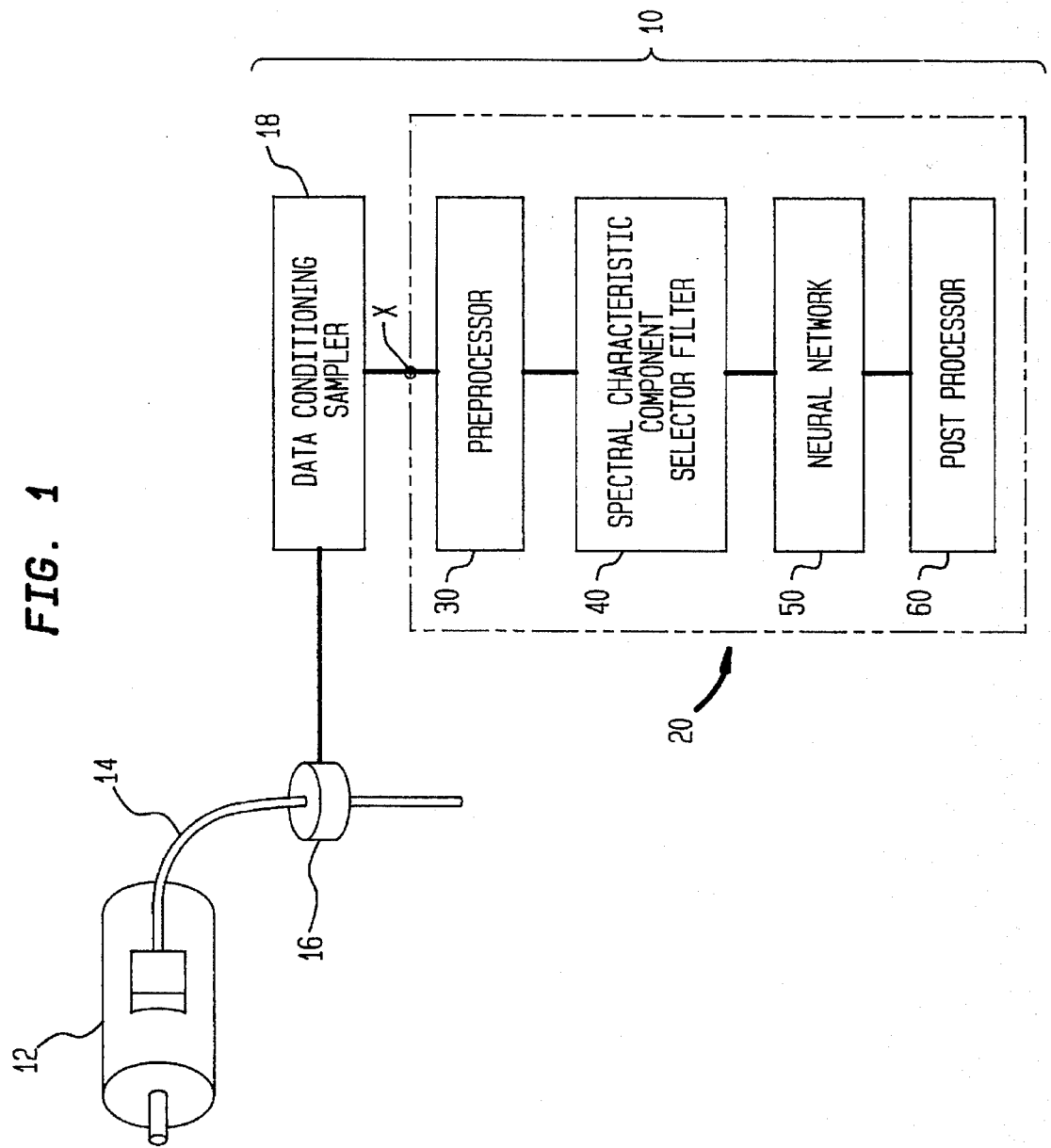
FIG. 1 is a block diagram of the apparatus for predicting electric motor failure of the present invention.

FIG. 1 shows a simplified block diagram of the motor failure prediction system 10 of the present invention. Motor 12 is fed power by an electrical distribution system, which is referred to diagrammatically as electric power line 14, it being understood that such a distribution system may include any form of industrial or commercial power distribution apparatus known in the art, such as switchgear, motor control centers, panelboards, busway ducts and the like manufactured and sold by the Electrical Apparatus Division of Siemens Energy & Automation, Inc. Motor 12 is contemplated to be any NEMA-size motors, such as those sold by the Motors & Drives Division of Siemens Energy & Automation, Inc. Motor 12 current (i.e., power line 14's waveform) is monitored by a control transformer 16. While only a single power line 14 and current transformer 16 is shown in order to maintain simplicity of FIG. 1, it should be understood by those skilled in the art that motor 12 will usually have either one or three phases of power and a neutral phase. In field applications, one or more of the power and neutral phases of the motor 12 may be monitored simultaneously.

The purpose of the failure prediction system of the present invention is to monitor the excitation provided to an induction motor and from the motor current signature to predict the fact that the motor is likely to fail several days prior to a disabling failure. Production equipment systems desirably should be of moderate cost, comparable to that of commercially available electronic motor controllers and easy to install in existing industrial sites. It is contemplated that one prediction system may be designed to service several motors.

The failure prediction system 10 of the preferred embodiment contains five processing sections as illustrated in FIG. 1. They are:

1. Data Conditioning Sampler 18, for generating a digitized signal representative of components of the motor 12 current signature; and
    a data processing system 20 for processing the digital signal, such as a digital personal computer 20 or a digital microcomputer on a single component chip, with or without auxiliary electronic memory devices, which executes programs that perform the following operations on digitized signals representative of components of the motor 12 current signature outputted from the sampler 18:

2. Preprocessor 30, for spectrally separating at least a representative portion of the motor 12 current into plural frequency domain components having respective frequencies and magnitudes and calculating the root-mean-square motor 12 current value;
3. Spectral Characteristic Component Selector Filter 40 for selecting for analysis at least one specific component of the motor 12 current signature;
4. Neural Network 50 for associating in real time the selected component with an operating condition of the motor 12 while the motor is operational by referencing a base of stored knowledge, which base of stored knowledge may include clusters or vectors configured within the neural network; and
5. Post Processor 60 which may optionally update the base of stored knowledge with information indicative of associations made with the neural network; and/or enunciate associations to the system user by way of sending warning messages to a power distribution system host monitoring computer, triggering alarms or issuing control signal outputs which for example may command a motor controller or protective relay to de-energize the motor 12 by cutting off its power supply.

A more detailed description of each section of the system follows.

1. Data Conditioning Sampler

Figure 2:
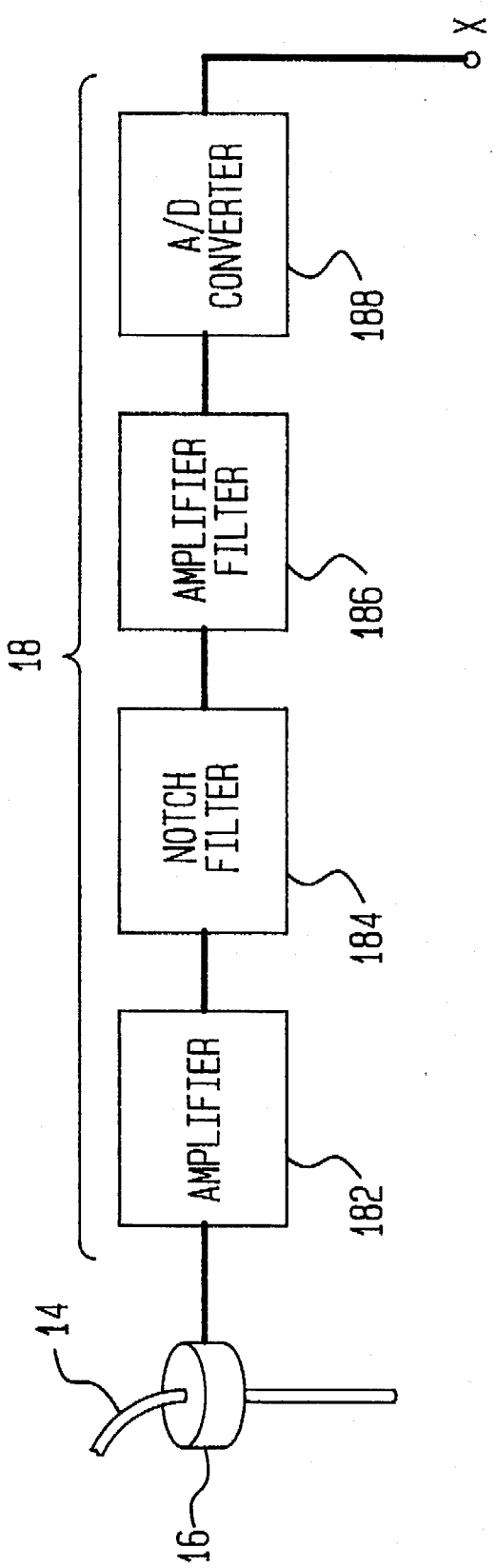
FIG. 2 is a more detailed block diagram of the data conditioning sampler of FIG. 1.

The purpose of the sampler section 18 is to monitor the induction motor current, to remove the electrical distribution system 14 excitation frequency component (usually 50 Hz or 60 Hz), to low pass filter the signal, and to sample the resulting signal at a periodic rate. A block diagram of the sampler section 18 is shown in FIG. 2. Referring to FIGS. 1 and 2, the voltage output of the control transformer 16 is passed to sampler 18 where it is amplified by amplifier 182 to approximately ±10 volts. Where multiple motor phases are being monitored, the sampler 18 can employ a known multiplexing arrangement to read the outputs from each current transformer 16. Part of the electrical distribution system main 60 hertz component is then canceled by notch filter 184 in order to increase the relative size of the failure signals with respect to the total signal amplitude on which the failure signals are superimposed. In countries where 50 hertz power frequency is utilized, the notch filter 184 would be chosen to cancel part of the 50 hertz frequency component.

The signal outputted from notch filter 184 can then be amplified again in amplifier filter 186 to make use of the full range of analog-to-digital converter 188. The analog-to-digital converter 188 samples the notch filter 184 output signal and the A/D converter digitized output, which is representative of components of the motor 12 current signature is available for further processing by the system of the present invention.

In order to elaborate, the sampler 18 will monitor the stator current to one phase of the induction motor 12 by means of the control transformer 16. Monitoring of a single phase rather than multiple phases is adequate for motor mechanical failure prediction. If the subject motor 12 is also being controlled by an electronic motor controller, such as the Siemens Advanced Motor Master System (SAMMS™), then the output signals from control transformers utilized by the motor controller may also be utilized by the failure prediction system 10 to monitor motor 12 current signature rather than utilization of separate, dedicated control transformers. The output of the control transformer 16 will be amplified by an operational amplifier 182 so that the rated motor 12 current will produce an amplifier voltage output that is equal to 70 percent of the maximum input range of the notch filter 184 input.

Figure 3:
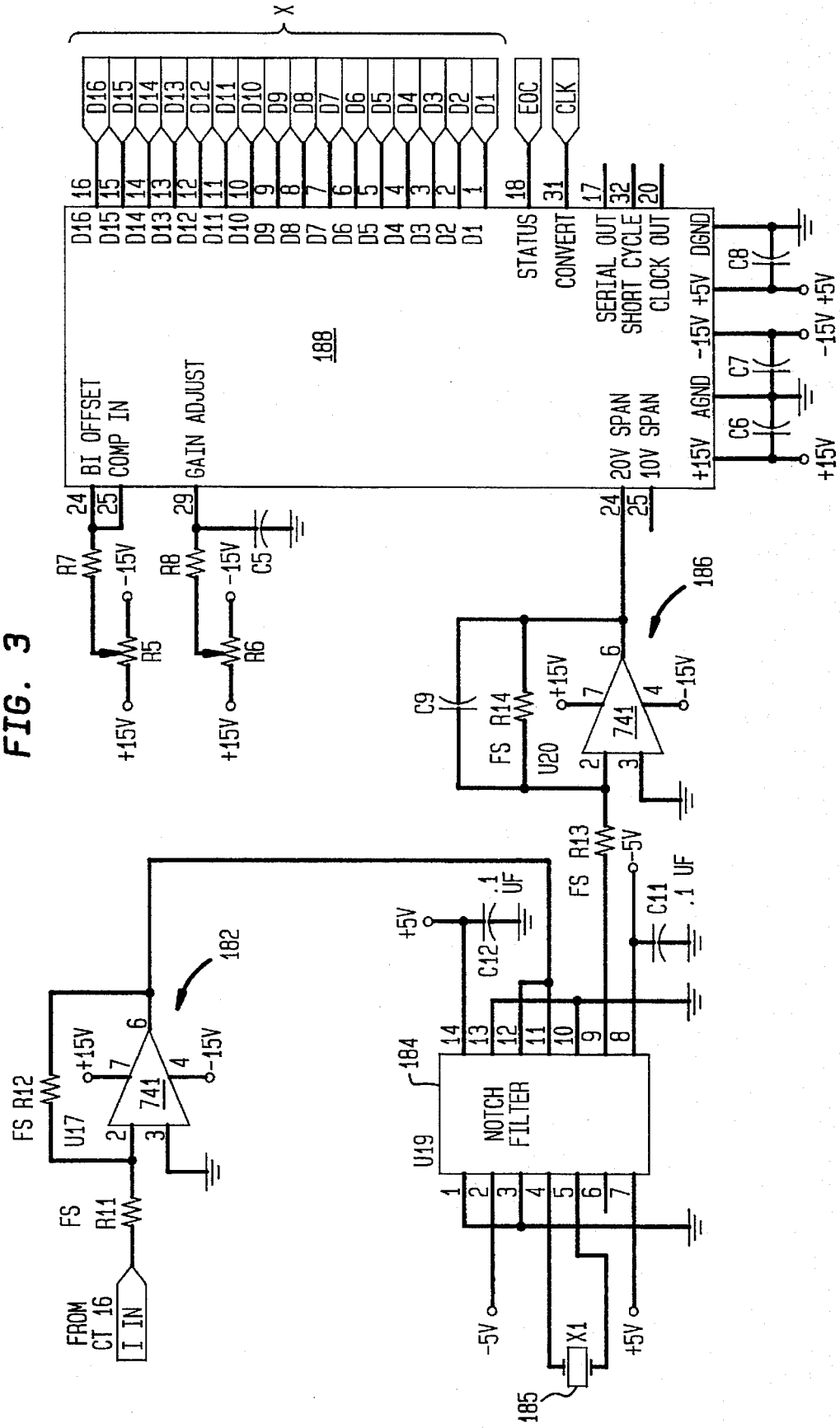
FIG. 3 is a schematic diagram of the data conditioning sampler of FIG. 2.

The notch filter 184 will reduce the 50 HZ or 60 HZ electrical distribution system power frequency component from the motor 12 current signal, preferably of the order of approximately 40 dB. The output of the notch filter will be amplified by an operational amplifier 186 so that the maximum output range of the filter will produce a voltage output from the amplifier that is equal to the maximum input range of the analog to digital converter 188. The analog to digital converter will be clocked by at a periodic rate that is an integer multiple of the 50 or 60 HZ power system excitation frequency. A complete circuit diagram of the sampler section is shown in FIG. 3 and is believed to be self-explanatory to those skilled in the art. By way of example, the amplifier 182 may be a model LM 741 operational amplifier manufactured by National Semiconductor Corporation of San Jose, Calif., U.S.A. The notch filter 184 may be a model LMF 90CMJ manufactured by National Semiconductor Corporation. Crystal oscillator 185 enables the notch filter to filter out the electrical distribution system excitation frequency. In a 60 Hz system, the oscillator frequency is 1920 Hz and it may be a model MC14060 manufactured by Motorola, Inc. of Schaumburg, Ill., U.S.A. Amplifier 186 may be a model LM 741 operational amplifier manufactured by National Semiconductor Corporation. The analog-to-digital converter may be a model ADC 71 manufactured by Analog Devices of Norwood, Mass., U.S.A.

Representative operational specifications of the sampler section are as follows:

a) Sampling Rate=1920 samples/second;
b) Number of Output Bits=8 or 16 Bits at the option of the user, depending upon desired resolution for acceptable performance thresholds;
c) Number of Samples=4096 to 32768; and
d) Excitation Frequency Rejection =40 dB, with no more than 3 dB rejection within 1.5 Hz of the excitation frequency.

Others practicing this invention may wish to utilize different operational specification parameters in other applications.

Digitized output of sampler 18, which is representative of components of the motor 12 current signature may be stored in a file on personal computer 20 by means of a known computer interface (not shown). The personal computer 20, executing operational programs, may be utilized for the remaining functions of the failure prediction apparatus of the present invention; however it should be understood that commercialized versions of the present invention might utilize dedicated hardware, software and firmware to accomplish the functions described herein. The other operations and functions of the system of the present invention are described in greater detail as follows.

2. Preprocessor

The purpose of the preprocessor section 30 is to convert the time domain information in the sampled data into a frequency domain (components comprising frequency and amplitude) representation of the motor 12 current data. The data preprocessing may be accomplished by the personal computer 20 implementing software transform algorithms, but known hardware is available to increase the processing speed if it is required.

The data are processed by performing a known Fast Fourier Transform (FFT) on the sampled data. The number of points used in the FFT is an integer power of two number (e.g., $2^N$) ranging from 4096 to 32768. Other suitable transform algorithms may include the known windowed FFT, Chirp-Z transform, and the wavelet transform.

For induction motors, the frequency bandwidth of interest appears to be 0–960 Hz, with a resolution of 0.1 Hz. This bandwidth and resolution renders satisfactory accuracy for failure prediction. That is, the preprocessor generates a spectral component at every 0.1 Hz interval from 0–960 Hz.

In the preferred embodiment, for each spectral frequency datum point of interest, 3 successive time domain sequence FFT samples are averaged by way of a moving window sampling technique. That is, before a new average sample datum point is calculated, the earliest of the 3 prior samples is discarded and replaced by new sample. Thereafter, the new group of 3 samples is averaged. If desired, more than 3 successive groups of samples may be used.

After deriving averaged data points by way of the moving window sampling technique, the preprocessor 30 has created a data set of averaged frequency components every 0.1 HZ within a bandwidth of 0–960 HZ.

After the digitized motor 12 current signature data have been converted from real domain components to spectrally separated frequency domain components, a number of techniques have been explored to combine frequency components that would likely represent a single signature in the motor power waveform. These techniques involve combining components that are close together in frequency value. One technique is to consider that the spectra of frequency versus magnitudes are hills and valleys in magnitude. All the magnitude components between adjacent valleys would be summed into a single frequency located at the hill frequency. This technique is motivated by the concept of the energy of the signature frequency being spread over several FFT frequencies. This technique would attempt to sum the energies into a single frequency. A representative computer program in C programming language for this process is listed in Appendix A.

Another frequency component combining technique would be to consider that the hill frequencies are the only important frequencies and to zero all frequencies that are not on the peak of a hill. A representative computer program in the C programming language for this component combining process is listed in Appendix B.

Another preprocessing approach is to ignore all frequencies that are below a definable magnitude threshold and then to sum all adjacent frequencies that are above the threshold. This approach is used in the preferred embodiment filter section of the processing system of the present invention. A representative computer program in the C programming language for this process is listed in Appendix C.

3. Spectral Characteristic Component Selector Frequency Filter

The preprocessing section 30 in the fault prediction system 10 generates a large number of frequency components. The large number of components is due to the frequency range of interest and the desired frequency resolution. It is desirable to maintain high resolution and frequency range; therefore other ways have to be adopted to reduce the number of components which must be analyzed.

The purpose of the component selector frequency filter 40 is to select for analysis at least one of specific spectral components, having frequency and magnitude values, from the relatively large number of components that need to be considered as part of the analysis process.

The FFT component signal output of the preprocessor 30 will include several thousand frequency components, many of which contain no useful motor failure information. The elimination of unneeded frequencies should be based on the motor operating characteristics and on the frequencies that are expected to contain failure information. Most of the information pertaining to the frequencies of interest are summarized in the Appendix D. The component selector frequency filter 40 should also act to reduce the effects of short term signals that might indicate a failure but would be present only for a short period of time.

The component selector filter 40 is implemented as a three stage process in which the filter "learns" the frequencies of interest and stores the learned information in a base of stored knowledge, such as in electronic, optical or magnetic memory devices. Preferably during all three stages of the component selection process, the excitation frequency component and all harmonics components of the excitation frequency are eliminated as frequencies of interest.

3. A Component Selector Filter—Stage One

During the first stage of the component selector 40 process any harmonic frequencies of the power line excitation frequency (e.g., n* 60 Hz) not previously filtered out are eliminated. Then an adaptive threshold is calculated from the FFT components obtained from the preprocessor 30. This threshold is calculated by first establishing the large frequency components as all components above a threshold value of dthres. Where dthres is defined as:

dthres=mthres*acomp acomp=average value of all frequency components=(sum of all components/number of components)

mthres=user defined multiplier

The remaining frequencies are defined as the small frequency components. A second threshold is then calculated as:

dthres=mthres * acomp acomp=average value of all small components

The filter 40 is adaptive in the sense that the two thresholds are recalculated for each set of frequency components derived from a power line 14 sample. Therefore, if the average value of the component data increases, then the threshold will also increase. The thresholds are preferably user defined and modifiable. It would also be possible to modify the filter 40 with a feedback loop to increase or decrease the threshold based on the number of components that currently exceed the threshold.

During the learning process a frequency table, which constitutes part of the base of stored knowledge, is generated and stored in the computer 20 that contains all frequency components that exceed the second threshold. This table contains the component number, the frequency, the number of occurrences, the minimum value of the component, the maximum value of the component, and the average value of the component. Frequency components that are adjacent to frequencies already in the table will be combined into the table as the table frequency. The size of this table is several times larger than the expected number of frequencies that will finally be used in the analysis. This learning process will proceed for a time period necessary for all normal operating conditions to occur.

3.B Component Selector Filter—Stage Two

The second stage of the filter 40 process is used to terminate the learning process and reduce the size of the frequency filter table. Two techniques are used to reduce the size of the frequency table. The first technique is to eliminate all frequencies that have occurred only a small number of times regardless of the number of entries in the table. The second technique reduces the table to a fixed size by eliminating the frequencies that have small magnitudes and have low occurrence.

The algorithm for the first technique is as follows. All frequencies that have occurred less than a specified number of times are removed from the table regardless of the size of the list. The threshold on the number of occurrences is given as:

othres=athres+(pthres /100.0)*flmax
othres=occurrence threshold
athres=absolute threshold—user supplied
pthres=proportional threshold—user supplied
flmax=maximum number of occurrences of any frequency in the frequency list The algorithm for the second technique is as follows. After the low occurrence frequencies have been removed, the list is reduced to a fixed size specified by the user. This process is accomplished by keeping the frequencies that have the highest "energy" ("energy" is defined as the number of occurrences times the average magnitude of the frequency).

energy=ctimes[j]*caver[j]
ctimes[j]=number of occurrences of jth frequency
caver[j]=average magnitude of the jth frequency 3.C Component Selector Filter—Stage Three The purpose of the stage three filter is to remove all the frequency components from the preprocessor output that are not in the frequency list but also allow new frequencies to be added to the list, so that these new frequency components can be added to the base of stored knowledge. The output of the stage three filter is the magnitudes of the frequencies in the filter table. The procedure for adding new frequencies is as follows. Each time a new frequency occurs that is above the second threshold, a weighted number is added to the new frequency table. Each time the new frequency is not present in the input sample, a value of one is removed from the frequency weight. When the new frequency weight exceeds the new frequency threshold, the new frequency is added to the standard frequency table. The result is that input data following the standard table update will output the new frequency as well as the old frequencies.

3.D Component Selector Filter—Alternative Approach

Another approach to the frequency filter 40 is to couple the selected frequencies very closely to the physics of the induction motor by means of defined "rules". Most of the rules specify definite frequencies in terms of the motor slip or rotational speed. These rules specify a definite set of frequencies that are of particular interest because they represent areas in the spectrum that are known to be coupled to particular motor faults. Since the slip of an induction motor is not a constant value during normal operation, the frequencies of interest may in fact be bands in the frequency spectrum wherein the width of the band is determined by the maximum variation in motor slip.

In this approach a set of frequency bands is calculated based on all of the physical rules available and the maximum slip variation. Each band is considered to be a single frequency with a magnitude equal to the largest component in the band and a frequency equal to the center frequency of the band. These band frequencies are selected as inputs to the neural network regardless of the component magnitudes. Other frequencies outside the calculated band are selected if they exceed a magnitude threshold.

As can be appreciated by those skilled in the art, other spectral component selection filtering techniques can be used to reduce data which must be analyzed by the neural network 50. For example, bandwidth and resolution can be reduced. Of course, it can also be appreciated by those skilled in the art that the availability of higher processing speed and more powerful neural networks may reduce or even eliminate the need for spectral component filtering.

4. Neural Network

Component selection filter 40 output is coupled to neural network 50, which by referencing a base of stored knowledge associates the selection filter output with an operating condition of the motor 12 or other electrical load device which is being monitored. One of many neural networks which is suitable for the fault prediction system of the present invention is an unsupervised, self-clustering-type algorithm network executed by the computer 20.

Program code for operating the preferred embodiment of the neural network that is executed on computer 20 and a brief description of that neural network, entitled "A neural network autoassociator for induction motor monitoring", are attached hereto in Appendix E. The program code of Appendix E is written in the C programming language, compiled with the C++ compiler Version 3.1 sold by Borland International, and is operable on IBM-type systems utilizing Disk Operating System (DOS). The attached Appendix E program code is subject to copyright protection. The copyright owner has no objection to the facsimile reproduction by anyone of this patent document or the patent disclosure as it appears in any governmental patent file or records, but otherwise reserves all copyright rights whatsoever. In all other respects, the inclusion of Appendix E in this document is not to be construed as granting of any license by the program code owner.

Other suitable neural networks which may be applied to the present invention are contemplated to include any other type of self-clustering algorithm or supervised classifier algorithms which classify inputs based upon prior knowledge. A suitable commercially available neural network software package is ART 2, sold by Science Applications International Corporation of San Diego, Calif., U.S.A. as part of its ANSim™ Software package.

Another type of self-clustering neural network suitable for the practice of the present invention takes the output frequency components from the frequency filter which are listed in the frequency table within the base of stored knowledge and forms vector clusters with unit magnitudes. Cluster size is user defined, and is analogous to defining a tolerance range in which a particular vector is deemed to fall within or outside the cluster. The network is trained for a designated period of time while the load device, such a motor 12, is in service and operational in the electrical distribution system. The training period may last several days to present a good cross section of motor data. After the training process, an output node should be formed for all of the normal operating signatures of the motor. When a new output node is formed, it is considered as a potential for a new condition in the motor and thereby a possible fault. The output nodes constitute a base of stored knowledge of associations of operating characteristics with frequency components. More detailed descriptions of this type of clustering algorithm appear in a paper entitled "Hardware Implementation of an ART 2 Neural Network for Intrapulse Analysis", as part of the 1992 Government Neural Networks Workshop, 24–26 August 1992, Dayton, Ohio and in "Hardware Implementation of Neural Networks" Final Project Report to U.S., Air Force at Wright Laboratories, project number WL-TR-93-1025, January 1993, both of which are published by the U.S. Air Force at Wright Laboratories, Dayton, Ohio, U.S.A.

In most neural network applications, the training of the network is accomplished while the system to be monitored is out of service, by utilization of an off-line computer using software to simulate the neural network hardware. The resulting weighting functions that result from the training are then transferred to a hardware neural network to implement a high speed network with large degrees of parallelism. In the typical neural network identification application, the network is trained with sets of data that represent all the possible inputs that could exist in the real world.

In applications involving the in-service prediction of faults during operation of motors of the present invention, the situation is different from frequently encountered, normal neural network applications. The three primary differences are:

1. Speed of fault association is not critically important;
2. In-service training of the network during motor operation is required; and
3. Training data are incomplete.

These differences affect the neural network implementation in a number of ways. The fact that fault association speed is not important means that the network 50 can be implemented in software executed by computer 20 instead of by dedicated hardware, which may greatly reduce the cost of the fault prediction system. The requirement for in-service training will increase the amount of software that must be run on the computer 20. This will tend to increase the price of the fault prediction system primarily in memory size. At the present time, memory is relatively cheap compared to other digital components.

The incomplete training data, due to not having failure data on the particular motor being monitored, will eliminate a number of so-called "supervised" neural network algorithms that could possibly be used in the fault prediction system. However, if more complete training data are available for an application, a supervised neural network may be suitable.

5. Post Processing

The post processor 60 in the failure prediction system 10 is used to add more time history to the prediction algorithm, i.e., increase the number of output nodes in the base of stored knowledge, and to help classify the faults into types of failures. The time history can be implemented as a simple digital filter on failure indications, so that a potential failure must occur for a reasonable amount of time in order to be classified as a real failure, rather than a mere transient phenomenon of no relevant interest.

It is also contemplated that the computer 20 will enunciate failure associations by utilizing apparatus and methods known in the art, such as by sounding alarms, sending warning messages to system operators, or shutting down operation of the motor 12 or other load device by issuing a trip command to an electronic motor controller or a motor contactor relay.

System Operation and Determination of Fault Condition

Referring to FIG. 1, the fault prediction system 10, coupled to control transformer 16, receives an analog power waveform carried by power line 14 that is influenced by an operating electrical load device which is being monitored, such as for example motor 12. The motor 12 may be actually in service in any known or unknown operating environment, for example in a factory environment, or in a diagnostic testing environment.

Data conditioning sampler 18 generates a digitized signal representative of components of the motor 12 current signature. The digitized signal is routed to data processing system 20, which executes programs that perform the following operations. The preprocessor 30 spectrally separates at least a representative portion of the motor 12 digitized current signal into plural components having respective frequencies and magnitudes.

The spectrally separated components are routed from preprocessor 30 to component selector filter 40, which selects for analysis at least one specific spectral component of the motor 12 current signature by referencing a base of stored knowledge of spectral components considered pertinent to failure prediction analysis. By way of example, it may be previously known that certain spectral frequency components are indicative of a type of motor mechanical defect, e.g., a bad rolling element bearing race, a broken rotor bar, etc., or that component magnitudes above defined threshold levels (intensity level and/or time duration) are indicative of potential fault conditions. Desirably, the component selector 40 updates the base of stored knowledge with new components which are identified to exceed user-defined threshold criteria. Component selector filter 40 monitors the spectrally separated current signature for such components identified in the base of stored knowledge, and if they are found, routes such component information to the neural network 50.

The neural network 50 associates in real time the selected signature components with an operating condition of the motor 12. In the case of cluster-type neural networks, the component information is converted into N dimension vectors. Each N dimension vector is compared to vector clusters previously configured in the network 50. The vector clusters are the base of stored knowledge which associates a specific signature component, as represented by an N dimension vector, with an operating condition. Clusters and their permissible vigilance may be preconfigured in the neural network 50 or may be added to the network when it is performing "learning" mode monitoring of the system. An example of a preconfigured cluster might be one which, based upon prior operating experience of a motor manufacturer, represents a defective bearing race or broken rotor bar. Any such information could be preprogrammed into the neural network by the failure prediction system manufacturer or downloaded from applications software by the ultimate system user.

The neural network 50 is also capable of self-configuration of association clusters when it is operated in "learning" mode. The network 50 is programmed to create clusters within user defined vigilance criteria. When the fault prediction system 10 is in learning mode, the component selector filter 40, using user defined threshold criteria (e.g., magnitude, longevity of phenomenon, prior user defined frequencies in the base of stored knowledge, clusters of associated frequencies, specific harmonic patterns, etc.) selects spectral components for further association by the neural network 50.

Each spectral component selected by the selector filter 40 becomes the basis for creation of a new neural net cluster. Conceptually, during learning mode the neural network 50 is being "trained" such that any newly-created cluster is indicative of a "normal" operating condition. For example, in a factory site being monitored by the fault prediction system 10, a pump powered intermittently by a large motor may create spectral components in the motor current which coincide in frequency with fault indicating components. While the fault prediction system is in learning mode, it will be "trained" that the pump motor current signature is a normal phenomenon, and it will create a cluster indicative of that spectral characteristic. Upon future detection of the pump motor spectral characteristic during regular monitoring operation of the system, the neural net 50 will associate the pump characteristic with expected, "normal" operation of the system. It is possible for the fault prediction system to "learn" spectral characteristics, created by other load devices connected to the electrical distribution system and associate them with operating characteristics.

One practical problem with utilizing a neural network which is only trained during on-site learning is that one must assume that the system is operating "normally", without eminent fault during the entire "learning" mode. Otherwise, a pre-existing fault will be considered to be "normal" system operation. Therefore, an alternative neural network 50 programming technique is to combine whatever rule-based knowledge is available with on-site "learning" mode training. In this manner, the neural net 50 is given a knowledge base of spectral components which the motor or failure prediction system manufacturer empirically knows are indicative of specific operating conditions and the failure prediction system self-adapts to site-specific electrical distribution system phenomena.

Once the neural network 50 associates a monitored spectral component with an operating characteristic, the post processor 60 updates the neural network 50 cluster configuration for any newly-detected characteristics, 60 when the failure prediction system 10 is in "learning" mode. When the system 10 is in monitoring mode, rather than in learning mode, the post processor 60 enunciates: (a) associations which have been previously programmed in the base of stored knowledge to be indicative of motor operating characteristics, such as a predicted or actual failure; and (b) any new N dimension vector which does not fall within any existing cluster. In situation (b), conceptually the system 10 enunciates to the system operator that it has detected a new phenomenon in the power signature which may require further investigation by the operator.

Figure 4:
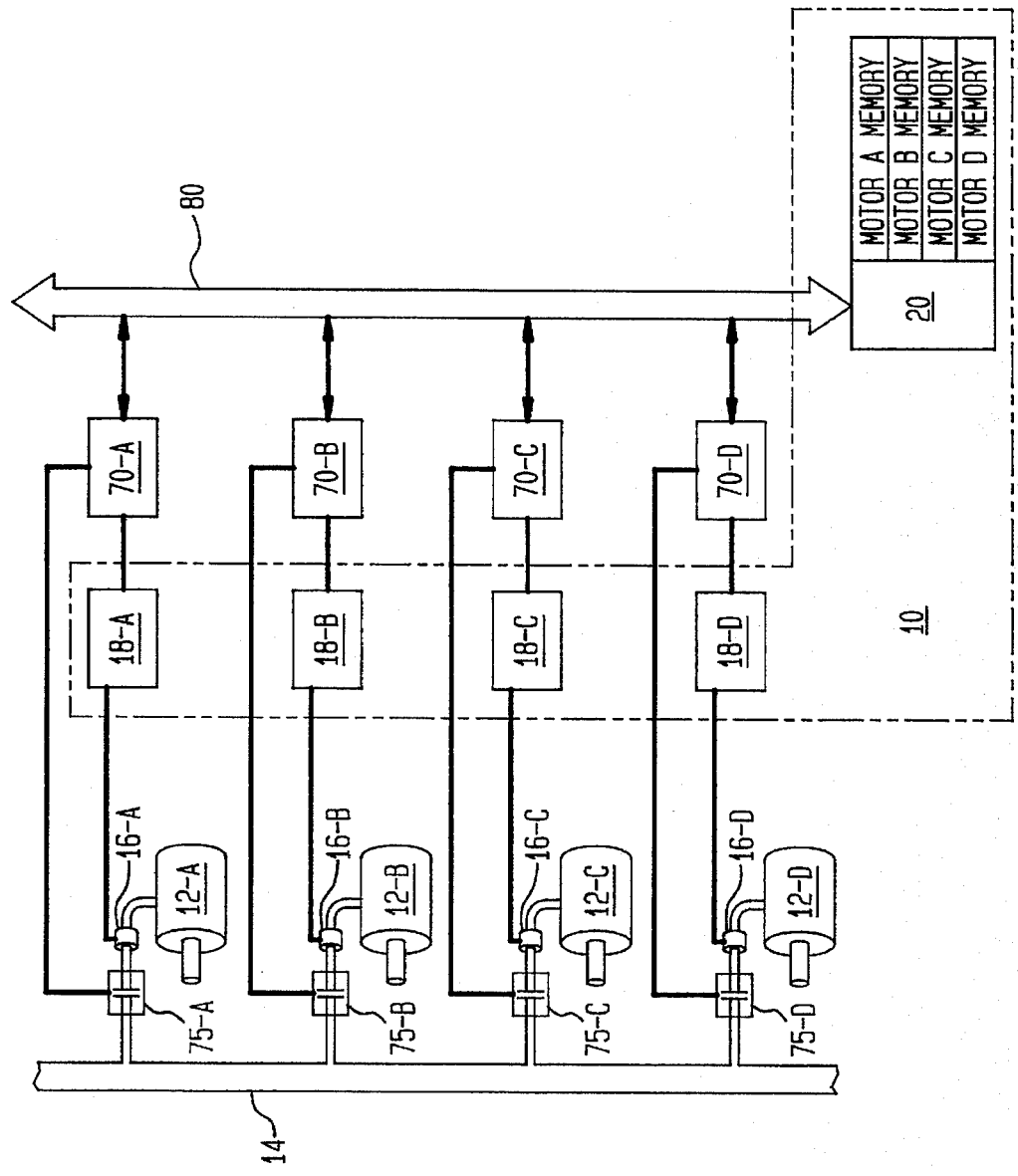
FIG. 4 is a block diagram of the apparatus of FIG. 1 in a multi-motor environment, wherein the system monitors more than one motor via a communications pathway.

Example of Application to Multiple Motors Connected to a Fault Prediction System Network The fault prediction system 10 may be utilized to monitor more than one motor in a networked configuration. The specific number of motors which can be monitored in a factory environment is only limited by the network capability. As shown in FIG. 4 a plurality of four motors 12-A, 12-B, 12-C, 12-D are powered by the electrical distribution system 14. Only a single power line is shown in order to simplify the figure. Each motor 12-A, 12-B, 12-C, 12-D has a separate control transformer 16-A through 16-D.

Each respective control transformer is coupled to a dedicated data conditioning sampler 18-A through 18-D, though it should be understood that a single sampler can be operated in a multiplexing fashion to service more than one motor. Each data sampler 18-A through 18-D is in turn coupled to a respective electronic motor controller 70-A through 70-D, which may be a Siemens Advanced Motor Master System™ electronic motor controller sold by the Electrical Apparatus Division of Siemens Energy & Automation Inc. Each motor controller 70 is in communication with data processing system 20 by any known communications pathway 80 employing any known communications protocol, such as Siemens Energy & Automation, Inc. SEABUS™ communications protocol which may be employed in Siemens Energy & Automation, Inc. ACCESS™ communications system.

As shown in FIG. 4, a single data processing system 20 services a plurality of motors 12-A through 12-D in a known multiplexing fashion. The data processing system 20 desirably maintains separate accessible memory, MOTOR A MEMORY through MOTOR D MEMORY, files for each respective motor. If desired, upon a failure prediction enunciation, the system 20 can issue a command to any one or more of the electronic motor controllers, 70-A through 70-D, to provide an alarm or trip command to motor contactor 75-A through 75-D so as to disconnect the motor from the power distribution system 14.

When the fault prediction system 10 embodiment shown in FIG. 4 is in operation, it continuously monitors all motors 12-A through 12-D, which are connected to the system in a serial fashion.

The computer programs and program code attached hereto in the Appendices are unpublished works which are subject to copyright protection. The copyright owners have no objection to the facsimile reproduction by anyone of this patent document or the patent disclosure as they appear in any governmental patent file or records, but they otherwise reserve all copyright rights whatsoever. In all other respects, the inclusion of the computer program code in this document is not to be construed as granting of any license by the owners.

While preferred embodiments of the present invention have been described herein, it should be understood that they are not intended to limit the scope of the invention, which is set forth in the claims which follow. Ones skilled in the art will appreciate that modifications and variations may be made to the preferred embodiments described in this specification, which will nonetheless fall within the scope of the claims.

APPENDIX A

COMBINING FREQUENCY COMPONENTS BY SUMMATION

© Siemens Energy & Automation, Inc.

This is an unpublished work of authorship. All rights reserved.

```
/*************************************************************/
/*    Program to Process Neural Network Data                 */
/*    Author: Jay H. Schlag                                  */
/*    FileName: nnff4.c                                      */
/*    Date: 9/17/92                                          */
/*    For: Georgia Institute of Technology                   */
/*    Sponsor: Siemens Corporation                           */
/*                                                           */
/*    Loop to sum the components between two valleys         */
/*    Mode 1 is defined as increasing input values           */
/*    Mode 2 is defined as decreasing input values           */
/*    A transition from Mode 1 to Mode 2 = a Peak            */
/*    A transition from Mode 2 to Mode 1 = a Valley          */
/*    Resulting Frequency Component Magnitude = accum        */
/*    Resulting Frequency = fcent                            */
accum = 0,0 ;
nextmod = 1;
for(i = 0; i < ncomp; i++)
{
mode = nextmod;
if(mode == 1)
{
if(fcomp[i + 1] >= fcomp[i])     /* M = 1 next > pres.*/
{
nextmod = 1;
accum = accum + fcomp[i];
fcomp[i] = 0.0;
}
if(fcomp[i + 1] < fcomp[i])      /* M = 1 next < pres.*/
{
nextmod = 2;
fcent = i;
accum = accum + fcomp[i];
fcomp[i] = 0.0;
}
}
```

```
if(mode == 2)
{
if(fcomp(i + 1] >= fcomp[i])        /* M = 2 next > pres.*/
  {
  nextmod = 1;
  fcomp[fcent] = accum + (fcomp[i]/2.0);
  accum = fcomp[i]/2.0;
  fcomp[i] = 0.0;
  }
if(fcomp(i + 1] < fcomp[i])         /* M = 2 next < pres.*/
  {
  nextmod = 2;
  accum = accum + fcomp[i];
  fcomp[i] = 0.0;
  }
}
}
```

APPENDIX B

COMBINING FREQUENCY COMPONENTS BY MAXIMUM PEAK

© Siemens Energy & Automation, Inc.

This is an unpublished work of authorship. All rights reserved.

```
/************************************************************/
/*    Program to Process Neural Network Data                */
/*    Author: Jay H. Schlag                                 */
/*    FileName: nnff4.c                                     */
/*    Date: 9/17/92                                         */
/*    For: Georgia Institute of Technology                  */
/*    Sponsor: Siemens Corporation                          */
/*                                                          */
/*    Loop to sum the components between two valleys        */
/*    Mode 1 is defined as increasing input values          */
/*    Mode 2 is defined as decreasing input values          */
/*    A transition from Mode 1 to Mode 2 = a Peak           */
/*    A transition from Mode 2 to Mode 1 = a Valley         */
/*    Resulting Frequency Component Magnitude = accum       */
/*    Resulting Frequency = fcent                           */
  accum = 0.0;
  nextmod = 1;
  for(i = 0; i < ncomp; i++)
    {
    mode = nextmod;
    if(mode == 1)
      {
      if(fcomp[i + 1] >= fcomp[i])    /* M = 1 next > pres.*/
        {
        nextmod = 1;
        fcomp[i] = 0.0;
        }
      if(fcomp[i + 1] < fcomp[i])     /* M = 1 next < pres.*/
        {
        nextmod = 2;
        fcent = i;
        accum = fcomp[i];
        fcomp[i] = 0.0;
        }
      }
    if(mode == 2)
      {
      if(fcomp[i + 1] >= fcomp[i])    /* M = 2 next > pres.*/
        {
        nextmod = 1;
        fcomp[fcent] = accum + (fcomp[i]/2.0);
        fcomp[i] = 0.0;
        }
      if(fcomp[i + 1] < fcomp[i])     /* M = 2 next < pres.*/
        {
        nextmod = 2;
        fcomp[i] = 0.0;
```

```
        }
      }
    }
```

APPENDIX C

ADJACENT FREQUENCY COMBINATION

© Siemens Energy & Automation, Inc.

This is an unpublished work of authorship. All rights reserved.

```
/************************************************************/
/*    Program to Process Neural Network Data                */
/*                                                          */
/*    Author: Jay H. Schlag                                 */
/*    FileName: nnff1.c                                     */
/*    Date: 8/6/92                                          */
/*    For: Georgia Institute of Technology                  */
/*    Sponsor: Siemens Corporation                          */
/*                                                          */
/*    *****                                                 */
/*      *                                                   */
/*    *****                                                 */
/*    * *                                                   */
/*      *                                                   */
/*         COMBINE CLOSE FREQUENCIES                        */
/*                                                          */
/*    Loop through the frequency table and combine all      */
/*    frequency components that are adjacent in the table   */
/*    and above the threshold.                              */ for( i = bcomp; i <= ncomp; i++)
    {
    if(fcomp[i] > dthres && fcomp[i + 1] > dthres)
      {
      fcomp[i + 1] = fcomp[i + 1] + fcomp[i] ;
      fcomp[i] = 0.0 ;
      }
    }
```

APPENDIX D

FREQUENCIES OF INTEREST

The spectral components are classified into the following four classes according to the definitions given below.

1. Class 1 Frequency. A Class 1 frequency is a FFT component that has been determined, by the physical structure of the motor, to potentially contain important failure information. This classification is independent of the magnitude of the FFT component. The class 1 components include, a) The frequencies associated with certain rotating imbalances are given by, $f_e \pm k \cdot f_{rot}$.

b) Frequencies associated with a fault in the inner bearing race are given by, $(f_{rot}(0.4\ n)) \pm f_e$.

c) Frequencies associated with a fault in the outer bearing race are given by, $f_{rot}(0.6\ n) \pm f_e$.

d) Frequencies associated with mounting problems are given by, $f_e \pm 0.5\ k \cdot f_{rot}$.

e) Frequencies associated with electrical unbalances in the rotor are given by, $$kf_{rot} \pm \left(f_e - \frac{p}{2} f_{rot}\right) \text{ where } k/(p/2) = 1,5,7,11,\ldots$$

where $f_e$ is the excitation frequency, $f_{rot}$ is the frequency of rotor rotation, n+number of balls in the bearing, and p is the number of motor poles.

2. Class 2 Frequency. A Class 2 frequency is a FFT component that has been determined to be of potential interested based on the current or past magnitude of the FFT component. The class 2 components include, a) Frequencies that stay consistently above a specified magnitude threshold are Class 2 frequencies.

3. Class 3 Frequency. A Class 3 frequency is a FFT component that presently has no potential interest based on the current and past magnitude of the FFT component. These frequencies may have importance at a later time period. The class 3 frequencies include:

(a) Frequencies that stay consistently below a specified magnitude threshold are Class 3 frequencies.

4. Class 4 Frequency. A Class 4 frequency is a FFT component that has been determined, by the physical structure of the motor, to contain no important information regarding the failure status of the motor. The excitation frequency and all harmonics of the excitation frequency, $f_e$, are Class 4 frequencies.

The following rules are utilized during the classification of spectral frequency components:

a) Frequencies that stay consistently below a specified magnitude threshold are Class 3 frequencies.

b) Class 3 frequencies may become Class 2 frequencies at a later time period.

c) Adjacent frequencies that form a frequency peak can be combined into a single frequency at the peak frequency.

d) A group of frequencies that form a broad peak have relatively more importance than a group of frequencies that form a narrow peak.

e) Failure signatures will continue for a long period of time.

f) Failures signatures will not decrease.

The following pseudo code may be helpful in implementing the spectral classifications set forth above.

Frequency Band Filter Description saminc=0.1171875
fexc=60
poles=4
fmininc=0.4
fmaxinc=2.5
err_limit=1.0
fincp=1.0
fincm=1.0
fbincp=5.0
fbincm=5.0

I. Find the rotational frequency and the rotational frequency component number

1. Description of Rotational Frequency

The rotational frequency (frot) is the actual speed of the rotor and will produce two frequency components above and below the excitation frequency. These two frequency components will produce upper and lower side bands of the excitation frequency and will be:

fusideb=fexc+frot[Upper Side Band]
    flsideb=fexc−frot[Lower Side Band]

The zero slip rotational frequency is the frequency of the magnetic field in the rotor air gap and would be the speed of the rotor if there was no rotor slip. The zero slip frequency is equal to the excitation frequency divided by the number of pole pairs.

fzsrot=fexc/(poles/2)

The zero slip frequency represents the upper limit of the rotational frequency and therefore the upper limit of the upper side band and the lower limit of the lower side band.

Define two terms:

fmininc=Increment between the zero slip frequency and the largest rotational frequency
    fmaxinc=Increment between the zero slip frequency and the smallest rotational frequency Therefore:

The upper rotational sideband will be in the range:

fexc+fzsrot−fmaxinc<fusideb<fexc+fzsrot−fmininc

The lower rotational sideband will be in the range:

fexc−fzsrot+fmininc<flsideb<fexc−fzsrot+fmaxinc

The frequency component of any frequency is equal to the frequency divided by the sample increment.

freq_comp=freq/saminc

2. Procedure for Calculating the Rotational Frequency

The procedure for find the rotational frequency will to find the frequency with the maximum magnitude in the range of the upper rotational sideband (fusideb). From this value the rotational frequency can be calculated as:

frot(uside)=fusideb−fexc

The frequency can also be determined by finding the frequency with the maximum magnitude in the range of the lower rotational sideband (flsideb). From this value the rotational frequency can be calculated as:

frot(lside)=fexc−flsideb

If the two calculations of the rotational frequency differ by some error limit then the measurement is not valid and the data should be collected again.

if(|frot(uside)−frot(lside)|>err_limit)=>error

3. Rotational Frequency Algorthim 3.1 Find Max Function:

Define a function for finding the maximum magnitude frequency component:

```
int find_max_comp (float fmin, float fmax) ;
{
cmin = fmin/saminc ;
cmax = fmax/saminc ;
c_mag_max = 0.0 ;
for(i = cmin; i < cmax + 1; i++)
    {
    if(fcomp[i] > cmax)
        {
        c_mag_max = fcomp[i] ;
        crot = i ;
        }
    }
return crot ; }
```

3.2 Find frot (uside):

To find the rotational frequency from the upper sideband components:

```
crot(uside) = find_max_comp(fexc + fzsrot − fmaxinc,
    fexc + fzsrot − fmininc) ;
/* crot = rotational frequency component */
frot(uside) = crot(uside) / saminc ;
/* frot = rotational frequency */
```

3.3 Find frot(lside):

To find the rotational frequency from the lower sideband components:

```
crot(lside) = find_max_comp(fexc – fzsrot + fmininc,
    fexc – fzsrot + fmaxinc) ;
/* crot = rotational frequency component */
frot(lside) = crot(lside) / saminc ;
/* frot = rotational frequency */
```

3.4 Compare Rotational Frequencies

```
if(|frot(uside) – frot(lside)| > err_limit) => error ;
```

3.5 Find Average Rotational Frequency and Store Components:

```
frot = (frot(uside) + frot(lside))/2.0;
fmag[1] = fcomp(crot(uside));
/* Rotational Component for k = 1+ */
fmag[2] = fcomp(crot(lside));
/* Rotational Component for k = 1– */
```

II. Calculate other Class 1 Frequencies:

1. Calculate other Rotational Harmonics:

```
1.1 Calculate k = 2+
    /* Frequency component = fexc + 2 + frot */
    crot(k = 2+) = find_max_comp(fexc * 2 * frot – fincm,
        fexc + 2 * frot + fincp);
    fmag[3] = fcomp(crot(k = 2+));
1.2 Calculate k = 3+
    /* Frequency component = fexc + 3 * frot */
    crot(k = 3+) = find_max_comp(fexc + 3 * frot – fincm,
        fexc + 3 * frot + fincP);
    fmag[4] = fcomp(crot(k = 3+));
1.3 Calculate k = 3–
    /* Frequency component = fexc – 3 * frot */
    crot(k = 3–) = find_max_comp(fexc – 3 * frot – fincm,
        fexc – 3 * frot + fincp);
    fmag[5] = fcomp(crot(k = 3–));
1.4 Calculate k = 4–
    /* Frequency component = fexc – 4 * frot */
    crot(k = 4–) = find_max_comp(fexc – 4 * frot – fincm,
        fexc – 4 * frot + fincp);
    fmag[6] = fcomp(crot(k = 4–));
1.5 Calculate k = 5–
    Frequency component = fexc – 5 * frot */
    crot(k = 5–) = find_max_comp(fexc – 5 * frot – fincm,
        fexc – 5 * frot + fincp);
    fmag[7] = fcomp(crot(k = 5–));
```

2. Calculate Mounting Frequency Harmonics:

```
2.1 Calculate k = 1+
    /* Frequency component = fexc + 1/2 * frot */
    crot(k = 1+) = find_max_comp(fexc + 1/2 * frot – fincm,
        fexc + 1/2 * frot + fincp);
    fmag[8] = fcomp(crot(k = 1+));
2.2 Calculate k = 1–
    /* Frequency component = fexc – 1/2 * frot */
    crot(k = 1–) = find_max_comp(fexc – 1/2 * frot – fincm,
        fexc – 1/2 * frot + fincp);
    fmag[9] = fcomp(crot(k = 1–));
2.3 Calculate k = 3+
    /* Frequency component = fexc + 3/2 * frot */
    crot(k = 3+) = find_max_comp(fexc + 3/2 * frot – fincm,
        fexc + 3/2 * frot + fincp);
    fmag[10] = fcomp(crot(k = 3+));
2.4 Calculate k = 3–
    /* Frequency component = fexc – 3/2 * frot */
    crot(k = 3–) = find_max_comp(fexc – 3/2 * frot – fincm,
        fexc – 3/2 * frot + fincp);
    fmag[11] = fcomp(crot(k = 3–));
2.5 Calculate k = 5–
    /* Frequency component = fexc – 5/2 * frot */
```

-continued

II. Calculate other Class 1 Frequencies:

```
    crot(k = 5–) = find_max_comp(fexc – 5/2 * frot – fincm,
        fexc – 5/2 * frot + fincp);
    fmag[12] = fcomp(crot(k = 5–));
```

3. Calculate Inner Race Frequency Harmonics:

```
3.1 Calculate bal = 7 k = 1–
    /* Frequency component = fexc – 1 * frot * .6 * 7 */
    fir = frot * 0.6 * 7;
    crot(b = 7–) = find_max_comp(fexc – fir – fbincm,
        fexc – fir + fbincp);
    fmag[13] = fcomp(crot(b = 7–));
3.2 Calculate bal = 8 k = 1–
    /* Frequency component = fexc – 1 * frot * .6 * 8 */
    fir = frot * 0.6 * 8;
    crot(b = 8–) = find_max_comp(fexc – fir – fbincm,
        fexc – fir + fbincp);
    fmag[14] = fcomp(crot(b = 8–));
3.3 Calculate bal = 9 k = 1–
    Frequency component = fexc – 1 * frot * .6 * 9 */
    fir = frot * 0.6 * 9;
    crot(b = 9–) = find_max_comp(fexc – fir – fbincm,
        fexc – fir + fbincp);
    fmag[15] = fcomp(crot(b = 9–));
3.4 Calculate bal = 10 k = 1–
    */ Frequency component = fexc – 1 * frot * .6 * 10 */
    fir = frot * 0.6 = * 10;
    crot(b = 10–) = find_max_comp(fexc – fir – fbincm,
        fexc – fir + fbincp);
    fmag[16] = fcomp(crot(b = 10–));
```

4. Calculate Outer Race Frequency Harmonics:

```
4.1 Calculate bal = 7 k = 1–
    /* Frequency component = fexc – 1 * frot + * .4 * 7 */
    for = frot * 0.6 * 7;
    crot(b = 7–) = find_max_comp(fexc – for – fbincm,
        fexc – for + fbincp);
    fmag[17] = fcomp(crot(b = 7–));
4.2 Calculate bal = 8 k = 1–
    /* Frequency component = fexc – 1 * frot * .4 * 8 */
    for = frot * 0.6 * 8;
    crot(b = 8–) = find_max_comp(fexc – for – fbincm,
        fexc – for + fbincp);
    fmag[18] = fcomp(crot(b = 8–));
4.3 Calculate bal = 9 k = 1–
    /* Frequency component = fexc – 1 * frot * .4 * 9 */
    for = frot * 0.6 * 9;
    crot(b = 9–) = find_max_comp(fexc – for – fbincm,
        fexc – for + fbincp);
    fmag[19] = fcomp(crot(b = 9–));
4.4 Calculate bal = 10 k = 1–
    /* Frequency component = fexc – 1 * frot * .4 * 10 */
    for = frot * 0.6 * 10;
    crot(b = 10–) = find_max_comp(fexc – for – fbincm,
        fexc – for + fbincp);
    fmag[20] = fcomp(crot(b = 10–));
```

APPENDIX E

NEURAL NETWORK PROGRAM CODE

© Siemens Corporate Research, Inc.

This is an unpublished work of authorship. All rights reserved.

Invention disclosure:

A neural network autoassociator for induction motor monitoring

The invention we describe here is a subsystem in a system designed to monitor an electric induction motor and indicate whether the motor is functioning properly or if it contains an internal fault which will lead to complete mechanical breakdown. The invention we describe here encompasses that portion of the system which processes a set of electric current measurements obtained by another portion of the system and produces an indication of "good" or "bad" if the motor appears to be functioning normally or abnormally, respectively.

Briefly, the invention models the set of normal current measurements for the motor being monitored, and indicates a potential failure whenever measurements from the motor deviate significantly from the model. In this case, the model takes the form of an neural network auto-associator which is "trained"—using current measurement collected while the motor is know to be healthy—to reproduce the inputs on the output. A new set of current measurements are classified as "good" or "bad" by first transforming the the measurement using and FFT and an internal scaling procedure then applying a subset of the transformed measurements as inputs to the network. A decision is generated based on the difference between the input and output of the network.

In the following, we will first present the labeling procedure which is currently implemented in software but we also give an equivalent hardware implementation. We then present the procedure used to initially adapt the system to a new motor. This same procedure is also used to adapt the system to any changes in the load or environment. Everything described here has been implemented in software that runs on a workstation or PC.

1 The labeling procedure

We assume that there exists a subsystem which measures the instantaneous current on a single phase of the power supply to a three phase electric induction motor and the RMS current on all three phases. We will call the single phase current measurements at time t, $c_t$, and the RMS current, $r_t$.

Beginning at some time arbitrarily called 0 (zero), we collect these measurements. At time K−1 (in our work so far, k=4096 or 16884), the K measures $c_0, \ldots, c_{K-1}$ are transform using a Fast Fourier Transform (FFT) to produce an estimate of the magnitudes of the frequency spectrum of the signal. We call the magnitude of the ith component of the FFT $\phi_i$. We further process this signal by scaling each component by the inverse of the magnitude of the largest component in the FFT, i.e., the FFT is scaled so that the relative magnitudes remain constant and the range of magnitudes cover [0,1].

In one instantiation, for each FFT (independent of all other FFTs) we compute $$x_i = \frac{1}{\max_{j \in I \phi_j} } (\phi_i - \min_{j \in I \phi_j}) \quad (1)$$

where I is a user defined index set that selects some subset of the components of the FFT. Assume I contains L elements. In other words, the user defines a subset of the components of the FFTs that are included. The remaining components are discarded. For each subsampled FFT, the system finds the largest and the smallest components The subsampled FFT is then translated and scaled so that the largest component maps to 1 (Or some other upper bound less than 1. We frequently use 0.98) and the smallest to 0 (Or some other lower bound greater than 0. We frequently use 0.02.)

Call the resulting set of L scaled magnitude components $x_0, \ldots, x_{L-1}$. Define $r_{max}$ to be the maximum RMS current. We define $$x_L = \frac{1}{r_{max}} \frac{1}{k} \sum_{i=0}^{K/2-1} r_t$$

and $X = x_0, \ldots, x_L$. I.e., the vector X consists of L scaled components of the FFT plus the scaled RMS current.

The vector X is applied as input to a neural network with sigmoidal, nonlinear units and a single hidden layer which can be described as:

$$\hat{x}_i = \sigma\left( \sum_{j=0}^{H-1} \omega_{i,j} \sigma\left( \sum_{k=0}^{K/2-1} v_{j,k} x_k - \theta_j^h \right) - \theta_i^o \right). \quad (2)$$

Where $\hat{x}_i$ (i=0, ..., K/2−1) is the ith output node of the network; H is the number of nodes in the hidden layer; $w_{i,j}$ is a weight on the output of hidden unit j when applied as input to output unit i; $\theta_i^o$ is the threshold for output unit i; $v_{i,j}$ is a weight on input $x_j$ when applied as input to hidden unit i; $\theta_i^h$ is the threshold for hidden unit i; and $\sigma(u)=(1+e^{-u})^{-1}$ where e is the base of the natural logarithm. (In FIG. 5, f=g=$\sigma$. We have used other functions for f and g also.)

Given the $x_i$ and $\hat{x}_i$, we compute an error metric $$d = (2/K) \sum_{i=0}^{K/2-1} (x_i - \hat{x}_i)^2.$$

We repeat this same procedure a total of L time to generate L error metrics $d_1, \ldots d_L$. The system then indicates that the motor is "good" if $$\sum_{i=0}^{L} d_i \leq \Theta$$

and that it is bad otherwise.

The entire labeling procedure then begins again.

Figure 5:
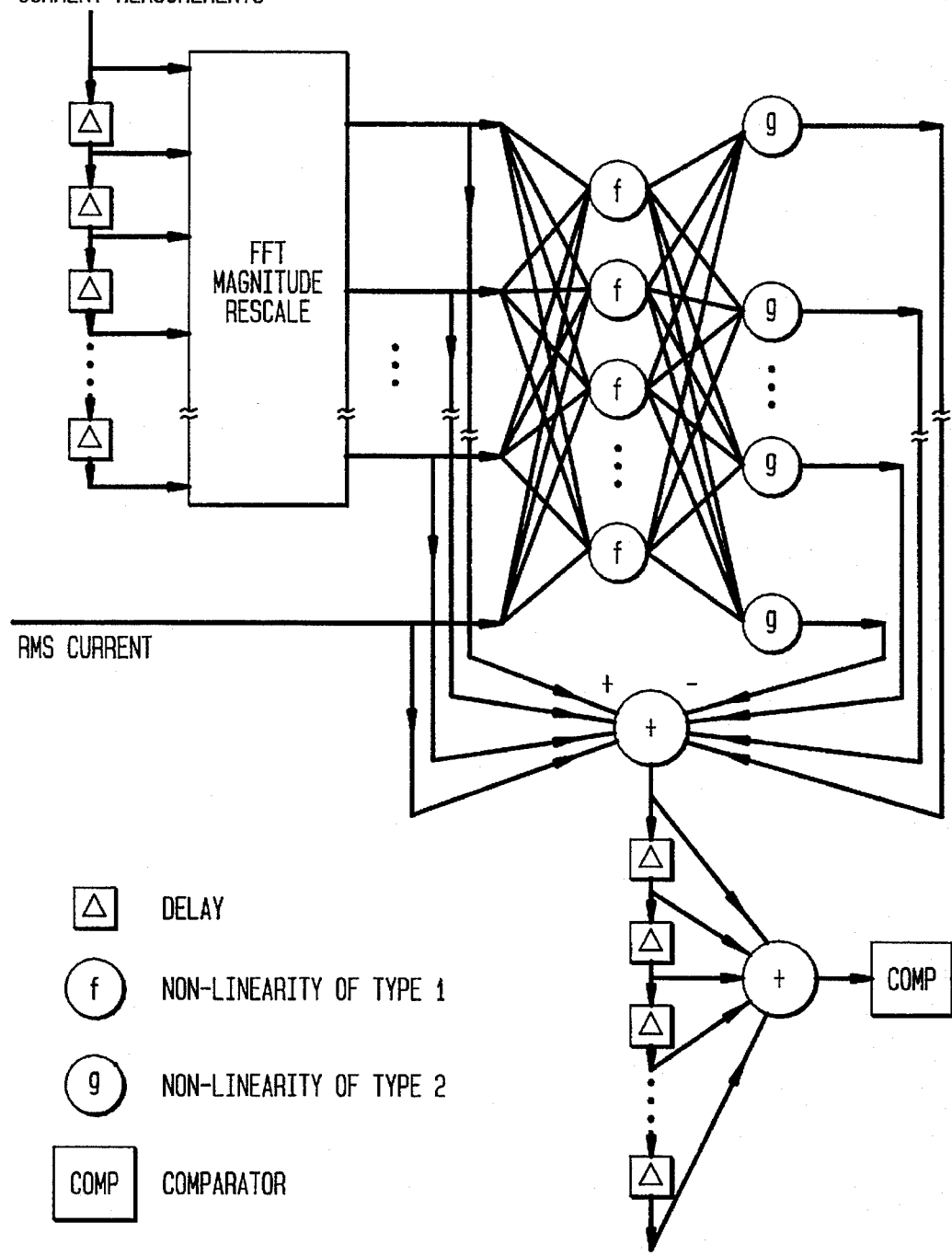
FIG. 5 is a schematic representation of a possible hardware implementation of the neural network autoassociator described in Appendix E herein.

A possible hardware implementation of this labeling procedure is shown in FIG. 5.

1.1 Adaptation

The uniqueness and effectiveness of this motor monitoring system stems from its ability to adapt to the particular motor that it is monitoring. This means that when the system is first installed the $w_{i,j}$, vi, j, $\theta_i^h$, $\theta_i^o$ and $\Theta$ are all randomly chosen or completely unknown when the system is exposed to a motor for the first time. The problem the system faces is to estimate good values for these parameters. Further, if the environment or load that the motor is driving changes, the system will need to re-estimate these parameters.

The parameters are estimate by collected a large set of current measurements during the period immediately after the monitor is installed and while the motor is assumed to be healthy. (We expect to periodically sample a motor over the course of a week to generate this training set.) The data is then segmented into vectors of length K (as above) and the same preprocessing —i.e., FFT and rescaling—as above is applied to each vector. For ease of explanation, assume that we have collected K * M current measurements $C_0, \ldots, C_{KM-1}$ and processed to produce M vectors $X^1, \ldots, X^M$. We use any one of the many optimization algorithms (usually simple gradient descent (aka error back propagation)) to choose the weights and thresholds in the neural network to minimize the mean square error, $$E = \frac{1}{MK} \sum_{m=1}^{M} \sum_{i=0}^{K} (x_i - \hat{x}_i)^2. \quad (3)$$

Given these estimates of the network parameters, on the same training set or another one, we compute $d_i = 1/K \Sigma_{i=0}^{K}$ $(x_i-\hat{x}_i)^2$, for $i=1, \ldots, N$. We then estimate $\Theta$ as $\Theta=\mu+as$, where $\mu=\Sigma_{i=1}^{N}d_i$ and $s=\Sigma_{i=1}^{N}(d_i-\mu)$ and a is a user definable parameter (which we take to be 1).

As an alternative, we have also used order statistics to estimate $\Theta$ such that $\Theta=m+ar$ where m is median of the $d_i$ and r is the distance between the upper and lower quartiles of the $d_i$. (The median of a set of numbers $x_1, \ldots, x_N$ is $x^*$ if the number of $x_i$ such that $x_i \geq x^*$ is the same as the number of $x_i$ such that $x_i \leq x^*$. The upper quartile of the set is $x_u$ such that ¼ of the $x_i$ are greater than $x_u$ and ¾ are less than $x_u$. The lower quartile of the set is $x_u$ such that ¼ of the $x_u$ are less than $x_u$ and ¾ are greater than $x_u$.) Again, a is a user definable parameter. We can also use some other range for R such as the smallest range that includes all the data except the upper and lower 10%.

What is claimed is:

1. A method for identifying an operating condition of an electrical device which operates as one of a power source and load on a power line of an alternating current electrical distribution system comprising:
   a. monitoring in real time a power line waveform having a signature influenced by driven loads associated with at least one electrical device;
   b. spectrally separating at least a representative portion of the power line waveform into a plurality of frequency-domain components;
   c. selecting automatically for analysis at least one specific component of the plurality of frequency-domain components based on at least one of frequency and magnitude values of the component by referencing a base of stored knowledge of representative operational characteristics of the electrical device;
   d. associating automatically without supervision the selected component with an operating condition of the electrical device by referencing the base of stored knowledge;
   e. enunciating a previously unknown electrical device operating condition to an output device; and
   f. updating the base of stored knowledge with at least one of at least a portion of new selected components and new electrical device operating condition associations, which have been identified during real-time monitoring.

2. A method for identifying an operating condition of an electric induction machine which operates as one of a power source and load on a power line of an electrical distribution system comprising:
   a. monitoring in real time a power line waveform having a signature influenced by driven loads associated with an electric induction machine;
   b. spectrally separating at least a representative portion of the power line waveform into a plurality frequency-domain components;
   c. selecting for analysis at least one specific component of the plurality of frequency-domain components based on at least one of frequency and magnitude values of the component by referencing a base of stored knowledge of representative operational characteristics of the induction machine;
   d. associating without supervision the selected component with an operating condition of the induction machine by referencing the base of stored knowledge; and
   e. updating the base of stored knowledge with at least one of at least a portion of new selected components and new induction machine operating condition associations, which have been identified during real-time monitoring.

3. A method for identifying an operating condition of an induction machine which operates as one of a power source and load on a power line of an electrical distribution system comprising:
   a. coupling an electric induction machine to a power line of an electrical distribution system and operating the machine;
   b. monitoring in real time power line waveform signature influenced by operating conditions of the machine;
   c. spectrally separating at least a representative portion of the power line waveform into a plurality of frequency-domain components;
   d. selecting for analysis at least one specific component of the plurality of frequency-domain components based on at least one of frequency and magnitude values of the component by referencing a base of stored knowledge of representative operational characteristics of the machine;
   e. associating the selected component with an operating condition of the machine by referencing the base of stored knowledge; and
   f. updating the base of stored knowledge with at least one of at least a portion of new selected components and new machine operating condition associations, which have been identified during real-time monitoring.

4. A method for identifying an operating condition of an electric induction machine which operates as one of a power source and load on a power line of an electrical distribution system comprising:
   a. coupling an electric induction machine to a power line of an electrical distribution system and operating the machine;
   b. monitoring in real time power line waveform having a signature influenced by operating conditions of the machine;
   c. spectrally separating at least a representative portion of the power line waveform into a plurality of frequency-domain components;
   d. selecting for analysis at least one specific component of the plurality of frequency-domain components based on at least one of frequency and magnitude values of the component by referencing a base of stored knowledge including at least one of a portion of component values and component selection criteria representative of operational characteristics of the machine;
   e. associating the selected component with an operating condition of the machine by referencing the base of stored knowledge; and
   f. updating the base of stored knowledge with at least one of at least a portion of new selected components and new machine operating condition associations, which have been identified during real-time monitoring.

5. A method for identifying an operating condition of an electric induction motor which draws a power load from a power line of an electrical distribution system comprising:
   a. powering an induction motor with a power line of an electrical distribution system;
   b. monitoring in real time power line current signature having specific spectral components influenced by operating conditions of the motor;
   c. selecting and analyzing automatically at least one of specific spectral components of the power line current by referencing a base of stored knowledge of representative operational characteristics of the motor;

d. associating automatically without supervision the selected component with an operating condition of the motor by referencing the base of stored knowledge;

e. identifying a previously unknown motor operating condition; and f. updating the base of stored knowledge with at least one of at least a portion of new selected components and new motor operating condition associations, which have been identified during real-time monitoring.

6. A method for identifying an operating condition of an electric induction motor which draws a power load on a power line of an electrical distribution system comprising:

a. powering a motor with a power line of an electrical distribution system;

b. monitoring continuously in real time power line current of at least a portion of the electrical distribution system having a current signature having specific frequency and magnitude components influenced by operating conditions of the motor;

c. selecting and analyzing automatically at least one of specific frequency and magnitude components of the power line current by referencing a base of stored knowledge of representative operational characteristics of the motor, including at least one of a list of at least a portion of component values and component selection criteria;

d. associating without supervision the selected component with an operating condition of the motor by referencing the base of stored knowledge;

e. identifying in real time a previously unknown motor operating condition; and f. updating the base of stored knowledge with at least a portion of new selected components and new motor operating condition associations, which have been identified during real-time monitoring.

7. The method of any one of claims 1, 2, 3, 4, 5 and 6, wherein the base of stored knowledge referenced in the selecting step includes at least one of specific component frequency and magnitude threshold values.

8. The method of claim 7 further comprising adding at least one component value to the base of stored knowledge after at least one of observing the electrical distribution system during operation thereof and identifying components generally indicative of specific system operational characteristics.

9. The method of any one of claims 1, 2, 3, 4, 5 and 6, wherein the associating step further comprises:

a. comparing at least one component value selected during the selecting step with information indicative of operational characteristics, which is stored within the base of stored knowledge; and b. identifying a correspondence of a selected component value with information in the base of stored knowledge.

10. The method of any one of claims 1, 2, 3, 4, 5 and 6, wherein the selecting step includes at least one of:

a. eliminating components which are harmonic frequencies of the power line excitation frequency;

b. eliminating components having magnitude values below undefined magnitude value thresholds;

c. eliminating components which occur less frequently than within defined time thresholds; and d. eliminating components having magnitude values below defined magnitude thresholds and which occur less frequently than within defined time thresholds.

11. The method of any one of claims 1, 2, 3, 4, 5 and 6, wherein the associating step is performed with a neural network and at least a portion of the base of stored knowledge is stored therein.

12. The method of claim 11, wherein the neural network is a classifying neural network.

13. The method of claim 11, wherein the neural network is a clustering neural network and at least a portion of the base of stored knowledge is stored as at least one cluster therein.

14. An apparatus for identifying an operating condition of an electrical device which operates as one of a power source and load on a power line of an alternating current electrical distribution system comprising:

a. a data conditioning sampler for monitoring in real time a power line waveform having a signature influenced by driven loads associated with at least one electrical device;

b. a preprocessor, coupled to the data conditioning sampler, for spectrally separating the power line current into a plurality of frequency-domain components;

c. a spectral characteristic component selector filter, coupled to the preprocessor, for selecting automatically for analysis at least one specific component of the plurality of frequency-domain components by referencing a base of electronically stored knowledge representative of operational characteristics of the electrical device;

d. an association device, coupled to the component selector filter, for associating automatically without supervision the selected component with an operating condition of the electrical device by referencing the base of stored knowledge and for updating the base of stored knowledge with at least one of at least a portion of new selected components and new electrical device operating condition associations, which have been identified during real-time monitoring; and e. an enunciation device coupled to the association device, for enunciating a previously unknown electrical device operating condition to an output device coupled thereto.

15. An apparatus for identifying an operating condition of an induction machine which operates as one of a power source and load on a power line of an electrical distribution system comprising:

a. a data conditioning sampler for monitoring in real time a power line waveform having a signature influenced by driven loads associated with an electric induction machine;

b. a preprocessor, coupled to the data conditioning sampler, for spectrally separating the power line waveform into a plurality of frequency-domain components;

c. a spectral characteristic component selector filter, coupled to the preprocessor, for selecting for analysis at least one specific component of the plurality of frequency-domain components by referencing a base of stored knowledge of representative operational characteristics of the electrical device;

d. an association device, coupled to the component selector filter, for associating without supervision the selected component with an operating condition of the induction machine by referencing the base of stored knowledge; and e. an updating device coupled to the base of stored knowledge and at least one of the component selector filter and the association device, for updating the base of stored knowledge with at least one of a portion of new selected components and new electric induction machine operating condition associations, which have been identified during real-time monitoring.

16. An apparatus for identifying an operating condition of an induction machine which operates as one of a power source and load on a power line of an electrical distribution system comprising:

a. an operational induction machine coupled to a power line of an electrical distribution system, the power line carrying a waveform having a signature influenced by operating conditions of the induction machine;
   b. a data conditioning sampler, coupled to the power line, for monitoring in real time the power line waveform;
   c. a preprocessor, coupled to the data conditioning sampler, for spectrally separating the waveform into a plurality frequency-domain components;
   d. a spectral characteristic component selector filter, coupled to the preprocessor, for selecting for analysis at least one specific component of the plurality of frequency-domain components by referencing a base of stored knowledge of representative operational characteristics of the machine;
   e. an association device, coupled to the component selector filter, for associating the selected component with an operating condition of the induction machine by referencing the base of stored knowledge; and
   f. an updating device, coupled to the base of stored knowledge and at least one of the component selector filter and the association device, for updating the base of stored knowledge with at least one of a portion of new selected components and new induction machine operating condition associations, which have been identified during real-time monitoring.

17. An apparatus for identifying an operating condition of an electric induction machine which operates as one of a power source and load on a power line of an electrical distribution system comprising:

a. an operational induction machine coupled to a power line of an electrical distribution system, the power line carrying a waveform having a signature influenced by operating conditions of the induction machine:
   b. a data conditioning sampler, coupled to the power line, for monitoring in real time the power line waveform;
   c. a preprocessor, coupled to the data conditioning sampler, for spectrally separating power line current into a plurality of frequency-domain components;
   d. a spectral characteristic component selector filter, coupled to the preprocessor, for selecting for analysis at least one specific component of the plurality of frequency-domain components based on at least one of frequency and magnitude values thereof, by referencing a base of stored knowledge including at least one or a portion of component values and component selection criteria representative of operational characteristics of the induction machine;
   e. an association device, coupled to the component selector filter, for associating the selected component with an operating condition of the induction machine by referencing the base of stored knowledge; and
   f. an updating device, coupled to the base of stored knowledge and at least one of the component selector filter and the association device, for updating the base of stored knowledge with at least one of a portion of new selected components and new induction machine operating condition associations, which have been identified during real-time monitoring.

18. An apparatus for identifying an operating condition of an electric induction motor which draws a power load from a power line of an electrical distribution system comprising:

a. an induction motor powered by a power line of an electrical distribution system, the power line carrying a waveform having a signature having specific spectral components influenced by motor operating conditions;
   b. a data conditioning sampler, coupled to the power line, for monitoring in real time the power line waveform;
   c. a spectral characteristic component selector filter, coupled to the data conditioning sampler, for selecting automatically for analysis at least one of the specific spectral components of the power line waveform by referencing a base of stored knowledge of representative operational characteristics of the motor;
   d. an association device, coupled to the component selector filter, for associating automatically without supervision the selected component with an operating condition of the motor by referencing the base of stored knowledge;
   e. an enunciation device, coupled to the association device, for identifying a previously unknown motor operating condition; and
   f. an updating device, coupled to the base of stored knowledge and at least one of the component selector filter and the association device, for updating the base of stored knowledge with at least one of a portion of new selected components and new motor operating condition associations, which have been identified during real-time monitoring.

19. An apparatus for identifying an operating condition of an electric inductor motor which draws a power load from a power line of an electrical distribution system comprising:

a. an operational induction motor powered by a power line of an electrical distribution system, the power line carrying a waveform having a signature having specific frequency and magnitude components influenced by motor operating conditions;
   b. a data conditioning sampler, coupled to the power line, for monitoring continuously in real time the power line waveform;
   c. a spectral characteristic component selector filter, coupled to the data conditioning sampler, for selecting automatically for analysis at least one of the specific frequency and magnitude components of the power line waveform by referencing a base of stored knowledge of representative operational characteristics of the motor, including at least one of a list of at least a portion of component values and component selection criteria;
   d. an association device, coupled to the component selector filter, for associating without supervision the selected component with an operating condition of the motor by referencing the base of stored knowledge;
   e. an enunciation device, coupled to the association device, for identifying in real time a previously unknown motor operating condition; and
   f. an updating device, coupled to the base of stored knowledge and at least one of the component selector filter and the association device, for updating the base of stored knowledge with at least one of a portion of new selected components and new motor operating condition associations, which have been identified during real-time monitoring.

20. An apparatus for identifying an operating condition of an electric induction motor which draws a power load from a power line of an electrical distribution system comprising:
   a. a data conditioning sampler for monitoring in real time power line current having specific frequency and magnitude components with values influenced by driven loads associated with an induction motor;
   b. a spectral characteristic component selector filter, coupled to the data conditioning sampler, for selecting for analysis at least one of the values of the specific frequency and magnitude components of the power line current by referencing a base of stored knowledge including at least one of:
      i. a list of at least a portion of component values, and
      ii. component selection criteria;
   c. an association device, coupled to the component selector filter, for associating in real time without supervision the selected component with a motor operating condition by referencing the base of stored knowledge; and
   d. an updating device, coupled to the base of stored knowledge and at least one of the component selector filter and the association device, for updating the base of stored knowledge with at least one of a portion of new selected components and new motor operating condition associations, which have been identified during real-time monitoring.

21. The apparatus of claim 20, further comprising:
   an enunciation device, coupled to the association device, for enunciating a previously unknown operating condition to an output device coupled thereto.

22. The apparatus of any one of claims 14, 15, 16, 17, 18, 19, 20 and 21, wherein the base of stored knowledge referenced by the spectral characteristic component selector filter includes at least one of specific frequency values and magnitude value threshold criteria of spectral components.

23. The apparatus of claim 22, wherein at least one component value is added to the base of stored knowledge after at least one of observing the electrical distribution system during in-service operation thereof and identifying at least one new component indicative of an operational characteristic.

24. The apparatus of any one of claims 14, 15, 16, 17, 18, 19, 20 and 21, wherein the association device compares at least one component value selected by the spectral characteristic component selector filter with information indicative of operational characteristics stored within the base of stored knowledge; and identifies a correspondence of a selected component value with information in the base of stored knowledge.

25. The apparatus of any one of claims 14, 15, 16, 17, 18, 19, 20 and 21, wherein the spectral characteristic component selector filter operates to perform at least one of:
   a. eliminating components which are harmonic frequencies of the power line excitation frequency;
   b. eliminating components having magnitude values below defined magnitude value thresholds;
   c. eliminating components which occur less frequently than within defined time thresholds; and
   d. eliminating components having magnitude values below defined magnitude value thresholds and which occur less frequently than within defined time thresholds.

26. The apparatus of any one of claims 14, 15, 16, 17, 18, 19, 20 and 21, wherein the association device is a neural network and at least a portion of the base of stored knowledge is stored therein.

27. The apparatus of claim 26, wherein the neural network is a classifying neural network.

28. The apparatus of claim 26, wherein the neural network is a clustering neural network and at least a portion of the base of stored knowledge is stored as at least one cluster herein.

29. The apparatus of claim 26, wherein the spectral characteristic component selector filter operates to perform at least one of:
   a. eliminating components which are harmonic frequencies of the power line excitation frequency;
   b. eliminating components having magnitude values below defined magnitude value thresholds;
   c. eliminating components which occur less frequently than within defined time thresholds; and
   d. eliminating components having magnitude values below defined magnitude value thresholds and which occur less.

* * * * *